United States Patent
Hirose

(10) Patent No.: US 8,542,520 B2
(45) Date of Patent: Sep. 24, 2013

(54) RESISTIVE MEMORY ELEMENT AND USE THEREOF

(75) Inventor: Sakyo Hirose, Yasu (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 161 days.

(21) Appl. No.: 13/212,229

(22) Filed: Aug. 18, 2011

(65) Prior Publication Data

US 2012/0092919 A1 Apr. 19, 2012

Related U.S. Application Data

(63) Continuation of application No. PCT/JP2009/065633, filed on Sep. 8, 2009.

(30) Foreign Application Priority Data

Feb. 20, 2009 (JP) .................................. 2009-038152

(51) Int. Cl.
*G11C 11/00* (2006.01)

(52) U.S. Cl.
USPC .......................................... 365/148; 365/163

(58) Field of Classification Search
USPC .......................................... 365/148, 163, 158
See application file for complete search history.

(56) References Cited

U.S. PATENT DOCUMENTS

| | | | |
|---|---|---|---|
| 4,942,375 A | 7/1990 | Petitjean et al. | |
| 6,639,262 B2 | 10/2003 | Paz de Araujo et al. | |
| 7,378,286 B2 | 5/2008 | Hsu et al. | |
| 7,452,740 B2 | 11/2008 | Kamei | |
| 7,649,768 B2 | 1/2010 | Hirose | |
| 8,030,695 B2 | 10/2011 | Ohnishi et al. | |
| 8,345,462 B2 * | 1/2013 | Ho et al. | 365/148 |
| 2003/0001178 A1 | 1/2003 | Hsu et al. | |
| 2007/0200158 A1 | 8/2007 | Genrikh et al. | |

(Continued)

FOREIGN PATENT DOCUMENTS

| | | |
|---|---|---|
| CN | 1767049 A | 5/2006 |
| EP | 1 612 805 A1 | 1/2006 |

(Continued)

OTHER PUBLICATIONS

M. Janousch et al.; "Role of oxygen vacancies in Cr-doped SrTiO3 for resistance-change memory"; Submitted on Jul. 4, 2007; Cornell University Library, http://arxiv.org/abs/0707.0563, date retrieved Nov. 10, 2011.

(Continued)

*Primary Examiner* — Vu Le
(74) *Attorney, Agent, or Firm* — Dickstein Shapiro LLP

(57) ABSTRACT

A resistive memory element that includes an element body and at least a pair of electrodes opposed to each other with at least a portion of the element body interposed therebetween. The element body is made of an oxide semiconductor as a polycrystalline body, which has a composition represented by the general formula: $Ti_{1-x}M_xO_2$, wherein M is selected from at least one of Fe, Co, Ni, and Cu; and $0.005 \leq x \leq 0.05$. The first electrode of the pair of electrodes is made of a material which can form a Schottky barrier which can develop a rectifying property and resistance change characteristics in an interface region between the first electrode and the element body. The second electrode is made of a material which provides a more ohmic junction to the element body as compared to that with the first electrode.

12 Claims, 10 Drawing Sheets

(56) References Cited

U.S. PATENT DOCUMENTS

| | | |
|---|---|---|
| 2009/0176345 A1 | 7/2009 | Saita et al. |
| 2010/0001254 A1 | 1/2010 | Hirose |
| 2010/0142262 A1 | 6/2010 | Tsukamoto et al. |
| 2011/0005817 A1 | 1/2011 | Ito et al. |

FOREIGN PATENT DOCUMENTS

| | | |
|---|---|---|
| JP | 1-032713 A | 2/1989 |
| JP | 9-082907 A | 3/1997 |
| JP | 10-135715 A | 5/1998 |
| JP | 2003-068983 A | 3/2003 |
| JP | 2004-297072 A | 10/2004 |
| JP | 2005-197670 A | 7/2005 |
| JP | 2005-236003 A | 9/2005 |
| JP | 2006-060209 A | 3/2006 |
| JP | 2006-147694 A | 6/2006 |
| JP | 2006-324447 A | 11/2006 |
| JP | 2007-235139 A | 9/2007 |
| JP | 2008-310859 A | 12/2008 |
| WO | WO-2008-007481 A1 | 1/2008 |
| WO | WO-2008-123139 A1 | 10/2008 |

OTHER PUBLICATIONS

PCT/JP2009/065633 Written Opinion dated Dec. 11, 2009.
PCT/JP2009/065633 International Search Report dated Dec. 11, 2009.

* cited by examiner

RESISTIVE MEMORY ELEMENT AND USE THEREOF

CROSS REFERENCE TO RELATED APPLICATIONS

The present application is a continuation of International Application No. PCT/JP2009/065633, filed Sep. 8, 2009, which claims priority to Japanese Patent Application No. JP2009-038152, filed Feb. 20, 2009, the entire contents of each of these applications being incorporated herein by reference in their entirety.

FIELD OF THE INVENTION

The present invention relates to a resistive memory element and a use thereof, and more particularly, relates to a resistive memory element including an element body made of an oxide semiconductor and a use thereof.

BACKGROUND OF THE INVENTION

Resistive memory elements include an element body which has resistive memory characteristics, and this element body exhibits, for example, a relatively high resistance in an initial state. When a voltage not less than a predetermined value is applied to the element body, the element body undergoes a change to a low resistance state, and this low resistance state is held (stored) even when the voltage is eliminated. On the other hand, when a voltage not less than a predetermined value is applied in the reverse direction to the element body in the low resistance state, the element body is returned to the high resistance state, and the high resistance state is held (stored) even when the voltage is eliminated.

This type of resistive memory element can be switched between a low resistance state and a high resistance state by applying a voltage not less than a threshold value in each of a forward direction and a reverse direction, and this switching allows the resistance to be changed and stored. The use of the resistive switching characteristics allows the resistive memory elements to be used not only as so-called resistive memory elements but also as switching elements.

It is believed that the resistive memory elements undergo a change in how electrons are likely to get over a barrier, by a change in the thickness of a depletion layer of a Schottky barrier, or by trapping or emission of electrons in or from the interface between an electrode and the element body made of a semiconductor and in or from a bulk level, thereby changing to the high resistance state and the low resistance state.

In the case of the resistive memory elements, there is a need to control the resistance with different voltages in polarity (referred to as bipolar), and basically, the resistive memory elements undergo switching from the high resistance state to the low resistance state when the voltage is applied to the forward side of a Schottky barrier, and switching from the low resistance state to the high resistance state when the voltage is applied to the reverse side thereof. The resistive memory elements are believed to develop the characteristics over the interface of the electrode, and supposed to be excellent in stability.

However, one of the problems is associated with resistance holding characteristics, and the resistive memory elements have the problem of poor stability particularly in the low resistance state, and switching the resistance to the high resistance state with an increase in temperature or with time, possibly because electrons are trapped in or emitted from the interface and the bulk level by the resistive switching. The techniques which can solve this problem include, for example, a technique described in Japanese Patent Application Laid-Open No. 2006-324447 (Patent Document 1).

Patent Document 1 proposes a technique for improving resistive memory characteristics. More specifically, Patent Document 1 adopts a Pt/Nb:SrTiO$_3$/insulating film/electrode structure in a resistive memory element which has a structure with an oxide semiconductor (for example, Nb:SrTiO$_3$) sandwiched by a first electrode (for example, a Pt electrode) which can form a Schottky barrier and another second electrode. In this case, the insulating film mentioned above is allowed to function as a barrier for suppressing electron emissions from interface traps in the oxide semiconductor, so that the probability of trapping or emitting electrons from the interface is reduced to result in an improvement in data holding characteristics (resistive memory effect).

However, in the case of the technique described in Patent Document 1, adverse effects such as a decrease in rate of resistance change and an increase in switching voltage are expected due to the introduction of the insulating layer.

Therefore, there is a need for a resistive memory element which provides a high rate of resistance change comparable to conventional cases and provides an excellent resistive memory effect without providing the insulating layer or the like as described above.

Patent Document 1: Japanese Patent Application Laid-Open No. 2006-324447

SUMMARY OF THE INVENTION

Therefore, an object of the present invention is to provide a resistive memory element which can satisfy the demand as described above, and a use thereof.

The present invention is first directed to, in a first aspect, a resistive memory element including an element body and at least a pair of electrodes opposed to each other with at least a portion of the element body interposed therebetween, wherein at least a portion of the element body located between the pair of electrodes is brought into a low resistance state when a switching voltage in a first direction is applied between the pair of electrodes, and then, the low resistance state of at least the portion located between the pair of electrodes is held even when the switching voltage in the first direction is eliminated, whereas at least a portion of the element body located between the pair of electrodes is brought into a high resistance state when a switching voltage in a second direction opposite to the first direction is applied between the pair of electrodes, and then, the high resistance state of at least the portion located between the pair of electrodes is held even when the switching voltage in the second direction is eliminated, and the resistive memory element characteristically includes the following features in order to solve the technical problem described above.

More specifically, the element body is characteristically made of an oxide semiconductor which has a composition represented by the general formula: Ti$_{1-x}$M$_x$O$_2$ (M is at least one from among Fe, Co, Ni, and Cu; 0.005≦x≦0.05).

The oxide semiconductor is preferably a polycrystalline body.

In the resistive memory element according to the present invention, at least one of the pair of electrodes is preferably made of a material which makes a Schottky junction with the element body.

The resistive memory element according to the present invention can be advantageously used for impedance matching.

A resistive memory element according to the present invention, in a second aspect, includes an element body and first and second electrodes provided so as to come into contact with the element body, and characteristically in the resistive memory element, the first electrode is made of a material which can form a Schottky barrier which can develop a rectifying property and resistance change characteristics in an interface region between the first electrode and the element body, the second electrode is made of a material which provides a more ohmic junction to the element body, as compared with the first electrode, and the element body is made of an oxide semiconductor which has a composition represented by the general formula: $Ti_{1-x}M_xO_2$ (M is at least one from among Fe, Co, Ni, and Cu; $0.005 \leq x \leq 0.05$).

It is to be noted that the phrase "the second electrode is made of a material which provides a more ohmic junction to the element body, as compared with the first electrode" means that the second electrode is made of such a material that provides a junction closer to ohmic characteristics in the case of the junction of the second electrode to the element body, as compared with the junction of the first electrode to the element body.

The present invention is also directed to a use of the resistive memory element according to the second aspect described above. The use of the resistive memory element according to the present invention characteristically includes the steps of: achieving a low resistance state of the resistive memory element by applying a first voltage pulse with a first polarity between the first and second electrodes; and achieving a high resistance state of the resistive memory element by applying a second voltage pulse with a second polarity opposite to the first polarity between the first and second electrodes.

The use of a resistive memory element according to the present invention preferably further includes a step of achieving at least one intermediate resistance state indicating a resistance value between the low resistance state and the high resistance state by applying, between the first and second electrodes, at least one intermediate voltage pulse with the first polarity or the second polarity and with energy between the first voltage pulse and the second voltage pulse.

As the intermediate voltage pulse, a pulse is preferably used which has an intermediate value between the first voltage pulse and the second voltage pulse for at least one selected from among pulse width, pulse amplitude, and pulse application frequency.

The preferable use as described above allows the resistive memory element to be used as a multivalued memory.

According to the present invention, a resistive memory element is achieved which has a high rate of resistance change and an excellent resistive memory effect. The reason can be presumed as follows.

The inventor has assumed, from resistive switching characteristics of the Schottky barrier type, that it is important to stabilize the trapping or emission of electrons in or from the interface and the bulk level for the improvement of the resistive switching characteristics and the resistive memory characteristics, and conceived the idea that the characteristics can be improved and stabilized when the transition metal is added to $TiO_2$ to form a level in the bandgap of the $TiO_2$.

Actually, the absorption resulting from the level formed in the bandgap can be confirmed from a diffuse reflection measurement for the $TiO_2$ with the transition metal added, and it is possible to believe that the formed level affects the trapping or emission of electrons, thereby allowing for the improvement of the resistance holding characteristics in the low resistance state. As a result, it is possible to believe that the excellent resistive memory effect has been achieved.

In the resistive memory element according to the present invention, when the oxide semiconductor constituting the element body is a polycrystalline body, the resistive memory effect, in particular, the resistance holding characteristics in the low resistance state can be further improved. This is believed to be because of the action of grain boundaries in the polycrystalline body. More specifically, providing discontinuous structures such as grain boundaries for trapping electrons to make electron traps and oxygen defects more likely to be produced is presumed to make a contribution to increasing the resistance in the low resistance state with time.

In the resistive memory element according to the present invention, when at least one of the pair of electrodes is made of a material which makes a Schottky junction with the element body, the effect of increasing the rate of resistance change is produced more prominently.

When the resistive memory element according to the present invention is used for impedance matching, the substantial change in impedance can be achieved with low power consumption.

In the use of the resistive memory element according to the present invention, the resistive memory element can provide multiple resistance values while achieving excellent memory characteristics, when the step of achieving at least one intermediate resistance state indicating a resistance value between the low resistance state and the high resistance state by applying, between the first and second electrodes, at least one intermediate voltage pulse with the first polarity or the second polarity and with energy between the first voltage pulse and the second voltage pulse is carried out in addition to the steps of: achieving a low resistance state of the resistive memory element by applying a first voltage pulse with a first polarity between the first and second electrodes; and achieving a high resistance state of the resistive memory element by applying a second voltage pulse with a second polarity opposite to the first polarity between the first and second electrodes.

In this case, the resistive memory element according to the present invention achieves a high rate of resistance change, and further provides favorable memory characteristics as described previously. Thus, the use of the resistive memory element can achieve multiple resistance states (multiple values) in a stable manner, and for example, makes it possible to use the resistive memory element as a multivalued memory device, or an analog memory device.

Therefore, in a use of the resistive memory element according to the present invention, the provision of multiple values as described above can hold multiple resistance states in a cell of the same size, and the storage capacity can be thus increased in the same cell size in the case of using the resistive memory element as a memory. In addition, the resistive memory element is also usable in analog applications, because the resistance value can be, rather than discrete values, varied continuously by varying the width, amplitude, etc. of the voltage pulse applied.

DETAILED DESCRIPTION OF THE INVENTION

Figure 1:
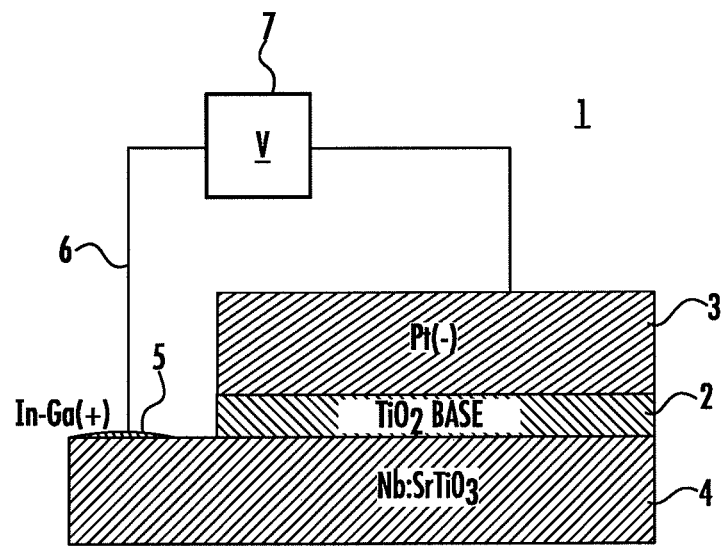
FIG. 1 is a cross-sectional view schematically illustrating a resistive memory element according to an embodiment of the present invention.

Referring to FIG. 1, a resistive memory element 1 includes an element body 2, and at least a pair of electrodes 3 and 4 opposed to each other with at least a portion of the element body 2 interposed therebetween. In this embodiment, the resistive memory element 1 has a capacitor structure with the thin-film element body 2 formed on the substrate-like lower electrode 4, and further with the thin-film upper electrode 3 formed thereon.

In the resistive memory element 1, when a switching voltage in a first direction is applied between the pair of electrodes 3 and 4, at least a portion of the element body 2 located between the pair of electrodes 3 and 4 is brought into a low resistance state, and then, the low resistance state of the element body 2 is held even when the switching voltage in the first direction is eliminated. On the other hand, when a switching voltage in a second direction opposite to the first direction is applied between the pair of electrodes 3 and 4, at least a portion of the element body 2 located between the pair of electrodes 3 and 4 is brought into a high resistance state, and then, the high resistance state of the element body 2 is held even when the switching voltage in the second direction is eliminated.

The element body 2 is made of an oxide semiconductor which has a composition represented by the general formula: $Ti_{1-x}M_xO_2$ (M is at least one transition metal from among Fe, Co, Ni, and Cu; $0.005 \leqq x \leqq 0.05$).

The thin film to serve as the element body 2 can be formed, for example, by using a PLD (Pulse Laser Deposition) method with the use of a target of predetermined composition. In this case, while an ArF or KrF excimer laser or the like is used as the laser, the laser is not to be considered limited to these lasers. The possible laser conditions for the deposition include energy of 0.1 to 3 $J/cm^2$, an frequency of 1 to 10 Hz, a temperature of 400 to 700° C., and the degree of vacuum of 0.1 Torr to $1 \times 10^{-5}$ Torr ($O_2$ flowing). As the deposition method, it is also possible to apply other methods, a MOCVD (Metal Organic Chemical Vapor Deposition) method, a RF sputtering method, and a MOD (Metal Organic deposition) method.

In addition, the target described above has the same composition represented by the general formula: $Ti_{1-x}M_xO_2$ (M is at least one from among Fe, Co, Ni, and Cu; $0.005 \leqq x \leqq 0.05$) as the element body 2 to be obtained, which is prepared by, for example, a solid phase reaction method. More specifically, with the use of, as raw materials, a high-purity $TiO_2$ powder as well as respective powders of $CO_3O_4$, $Fe_2O_3$, NiO, and CuO, if necessary, the powders are weighed so as to provide a predetermined composition, and then mixed for adequate mixing in an agate mortar with the addition of ethanol. The powders are subjected to drying, followed by the addition of a binder, and to firing and then shape forming with the use of a high-pressure press and a mold. The molded product obtained is subjected to degreasing, and then to firing in the air for 4 hours by applying a temperature of 1100° C. to 1200° C., thereby allowing for the achievement of a target.

The upper electrode 3 is made of a material which can form a Schottky barrier which can develop a rectifying property and resistance change characteristics in an interface region between the electrode 3 and the element body 2. Therefore, a material with a larger work function than that of the $TiO_2$ based material as a main constituent of the element body 2, for example, Pt is advantageously used as the material of the upper electrode 3. It is to be noted that the material of the upper electrode 3 is not limited to Pt, and noble metals such as Au, Ag, and Pd, oxides such as $SrRuO_3$ which provide metallic conduction, organic conductors such as PEDOT:PSS, nitride conductors, etc. may be used as long as a Schottky junction can be formed.

The lower electrode 4 may be made of a material which provides a more ohmic junction to the element body 2, as compared with the upper electrode 3, and preferably, the lower electrode 4 is made of a material which provides an ohmic junction. In addition, a material is preferably used which has a work function smaller than or comparable to that of the $TiO_2$ based material as a main constituent of the element body 2. As an example, the lower electrode 4 is made of $Nb:SrTiO_3$. In addition, depending on the device formation process, it is possible to achieve a junction close to an ohmic junction even in the case of using a metal with a larger work function, and thus, for example, Ti, Al, In, Zn, TiN, and noble metal electrodes, etc. can also be used besides $Nb:SrTiO_3$. These metals are each used alone, or used, for example, in such a structure with a Ti electrode as an ohmic electrode formed on the element body according to the present invention, and with a Pt electrode formed thereon for preventing the oxidation of the Ti electrode.

As described above, in the preferable embodiment, the upper electrode 3 has a Schottky barrier formed, whereas an electrode which provides ohmic characteristics or almost ohmic characteristics is used for the lower electrode 4. However, any of the upper electrode 3 and the lower electrode 4 may have a Schottky barrier formed.

Alternatively, the resistive memory element 1 may have a planar structure with the two electrodes 3 and 4 formed side by side with each other on a $TiO_2$ based thin film to serve as the element body 2, rather than the capacitor structure shown as in the embodiment. In addition, the element body 2 may be provided by a bulk body, rather than a thin film.

In addition, while electrons are controlled by controlling the oxygen partial pressure during deposition in the present invention, the carrier concentration may be controlled with the addition of an element serving as a donor, if necessary, depending on the process conditions and the approach.

Next, experimental examples will be described which were carried out to examine the advantageous effects of the resistive memory element according to the present invention.

Experimental Example 1

Prepared by a solid phase reaction method was a ceramic target (diameter: 20 mm, thickness: 5 mm) represented by the general formula: $Ti_{1-x}M_xO_2$ (M is any of Cr, Mn, Co, Fe, Ni, and Cu). With the use of, as raw materials, respective powders of high-purity $TiO_2$, $Mn_3O_4$, $Cr_2O_3$, $CO_3O_4$, $Fe_2O_2$, NiO, and CuO, the powders were weighed so as to provide the predetermined compositions shown in Table 1, and then mixed for adequate mixing in an agate mortar with the addition of ethanol. Next, the powders were subjected to drying, followed by the addition of a binder, and to firing and then shape forming with the use of a high-pressure press and a mold so as to provide a diameter of about 20 mm and a thickness of about 5 mm. This compact was subjected to degreasing, and then to firing in the air for 4 hours at a temperature of 1100° C., thereby providing a target.

On the other hand, a Nb 0.5 at % doped $SrTiO_3$ (100) single-crystalline substrate (from Furuuchi Chemical Corporation) was prepared to serve as a lower electrode for providing an almost ohmic junction with a $TiO_2$ based thin film to serve as the element body.

Next, the target was used to create, on the substrate, a $Ti_{1-x}M_xO_2$ thin film to serve as the element body on the order of 100 nm in film thickness by a PLD method. In this case, with the use of an ArF excimer laser from Lambda Physics "Compex 110" as the laser, laser light generated was collected and made incident into the target to create the thin film. The conditions for the laser during the deposition were set at energy of 1 $J/cm^2$, a frequency of 10 Hz, a temperature of 600° C., and the degree of vacuum of 0.1 Torr ($O_2$ flowing).

Further, the composition analysis for the thin films created as described above was carried out by fluorescence X-ray measurement or the like to confirm that the thin films have substantially the same compositions as the targets used in the creation of the thin films for all of the samples.

Next, an upper electrode made of Pt with a diameter of 300 μm was formed on the thin films by a DC sputtering method with the use of a metal mask.

For the resistive memory element 1 according to the thus obtained sample, as shown in FIG. 1, an extraction electrode 5 made of In—Ga was formed on the lower electrode 4, and a current voltage generator 7 was connected between the extraction electrode 5 and the upper electrode 3 while bringing a W probe 6 into contact with the extraction electrode 5 to evaluate the current-voltage characteristics and evaluate the resistance holding characteristics at room temperature and 100° C. A current voltage generator "R6246A" from Advantest Corporation was used as the current voltage generator 7.

It is to be noted that sample 32 is a comparative example in Table 1. Samples 1 to 31 had a structure of Pt/$TiO_2$/Nb:$SrTiO_3$/In—Ga, whereas the structure of Pt/Nb:$SrTiO_3$/In—Ga was prepared without the presence of the $TiO_2$ based thin film for sample 32. Therefore, samples 1 to 31 will be evaluated for the characteristics at the interface between Pt and $TiO_2$, whereas sample 32 will be evaluated for the characteristics at the interface between Pt and Nb:$SrTiO_3$.

Figure 2:
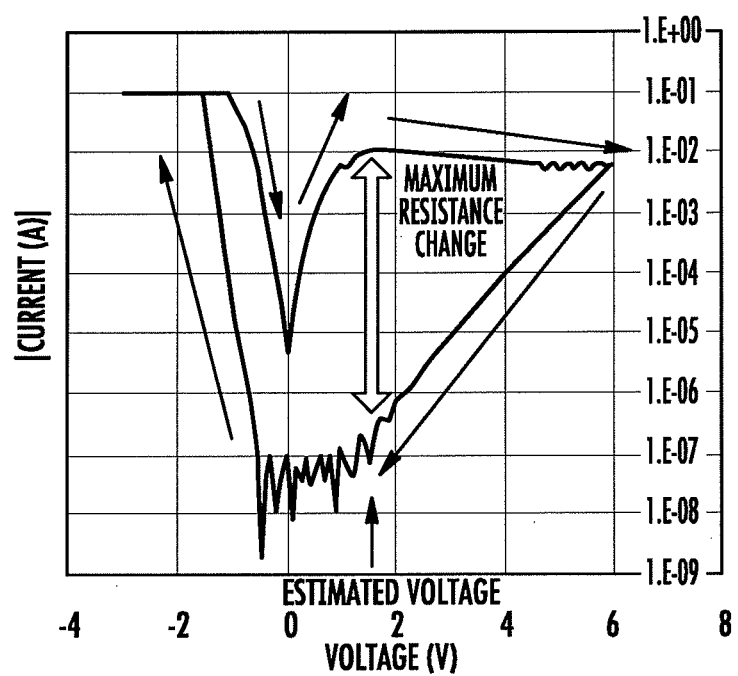
FIG. 2 is a diagram showing current-voltage characteristics of a resistive memory element according to sample 14 within the scope of the present invention, which were obtained in Experimental Example 1.

For the evaluation of current-voltage characteristics, the current flowing through the resistive memory element was measured while sweeping the voltage applied to the resistive memory element in such a way as $-X(V) \Rightarrow 0V \Rightarrow Y(V) \Rightarrow 0V \Rightarrow -X(V)$ (X and Y are any voltage values). Then, as shown in FIG. 2, the voltage providing the most change with the polarity of switching from a low resistance state to a high resistance state was regarded as an "estimated voltage" in the current-voltage characteristics, and the rate of resistance change at the "estimated voltage" was calculated on the basis of the formula of Rate of Resistance Change [%]= (Resistance Value in High Resistance State−Resistance Value in Low Resistance State)/Resistance Value in Low Resistance State×100. The results are shown in the column "Rate of Resistance Change" of Table 1.

It is to be noted that the current-voltage characteristics shown in FIG. 2 correspond to sample 14 in Table 1.

Figure 3:
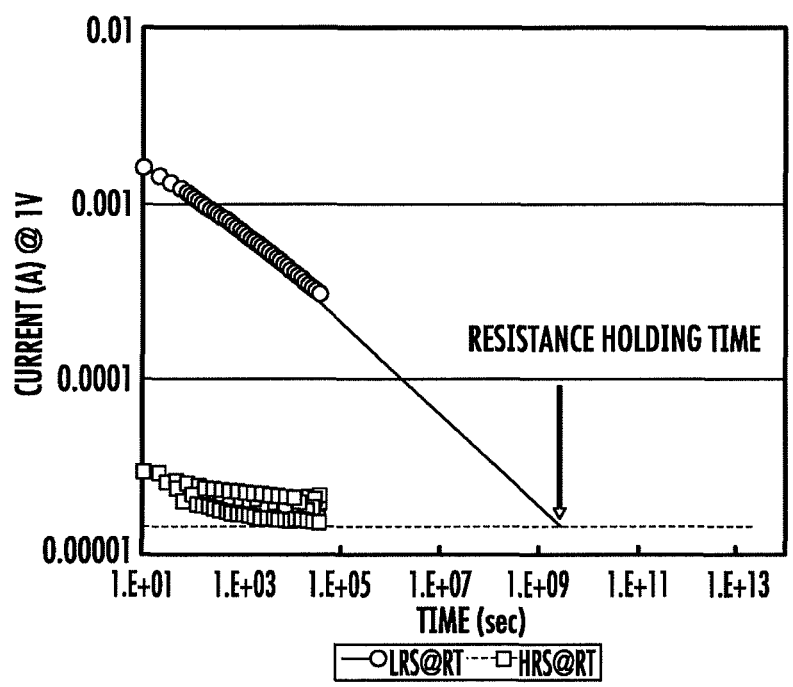
FIG. 3 is a diagram showing resistance holding characteristics at room temperature for a resistive memory element according to sample 32 outside the scope of the present invention, obtained in Experimental Example 1.

In addition, for the evaluation of resistance holding characteristics as an indicator of the resistive memory effect, the resistance was measured at a voltage of 2 V every 10 seconds for 10 hours after switching to each of a high resistance state and a low resistance state, and the change in the resistance with time was measured at each of room temperature and 100° C. to evaluate the stability of the resistance. More specifically, as shown in FIG. 3 for sample 32, a straight line was drawn from each of logarithmic plots (Log vs. Log) of resistance value vs. time, the time of the resistance value in the low resistance state in agreement with the resistance value in the high resistance state was defined as resistance holding time, and this resistance holding time was obtained. The results are shown in the column "Resistance Holding Time" of Table 1. In FIG. 3, the term "LRS" indicates a low resistance state, the term "HRS" indicates a high resistance state, and the term "RT" indicates room temperature. In addition, in FIG. 4 described below, the term "100 C" indicates 100° C. These also apply to the other drawings and Table 1.

In addition, the resistance holding time obtained as described previously is absolutely intended to monitor the trend of the resistive memory effect, not to indicate the actual resistive memory effect time, and considered as a sufficient evaluation factor for relative comparison.

It is to be noted that the resistance holding time at room temperature was evaluated for only sample 14 and sample 32. In addition, the resistance holding time at 100° C. was evaluated for only the samples exhibiting 1000% or more for the rate of resistance change.

TABLE 1

| Sample Number | $Ti_{1-x}M_xO_2$ Additive Element (M) | $Ti_{1-x}M_xO_2$ Additive Amount (x) | Rate of Resistance Change [%] | Resistance Holding Time [day] @RT | Resistance Holding Time [day] @100 C. |
|---|---|---|---|---|---|
| *1 | — | 0 | 58 | — | — |
| *2 | Cr | 0.001 | 67 | — | — |
| *3 | Cr | 0.005 | 88 | — | — |
| *4 | Cr | 0.01 | 50 | — | — |
| *5 | Cr | 0.05 | 48 | — | — |
| *6 | Cr | 0.1 | 24 | — | — |
| *7 | Mn | 0.001 | 33 | — | — |
| *8 | Mn | 0.005 | 50 | — | — |
| *9 | Mn | 0.01 | 45 | — | — |
| *10 | Mn | 0.05 | 35 | — | — |
| *11 | Mn | 0.1 | 9 | — | — |
| *12 | Co | 0.001 | 2200 | — | 75 |
| 13 | Co | 0.005 | 48000 | — | 760000 |
| 14 | Co | 0.01 | 100000 | $4 \times 10^{+13}$ | 120000 |
| 15 | Co | 0.05 | 32000 | — | 430000 |
| *16 | Co | 0.1 | 44 | — | — |
| *17 | Fe | 0.001 | 2700 | — | 100 |
| 18 | Fe | 0.005 | 35000 | — | 2600 |
| 19 | Fe | 0.01 | 28000 | — | 51000 |
| 20 | Fe | 0.05 | 30500 | — | 3600 |
| *21 | Fe | 0.1 | 70 | — | — |
| *22 | Ni | 0.001 | 1200 | — | 130 |
| 23 | Ni | 0.005 | 8900 | — | 2600 |
| 24 | Ni | 0.01 | 9100 | — | 51000 |
| 25 | Ni | 0.05 | 7500 | — | 3600 |
| *26 | Ni | 0.1 | 33 | — | — |
| *27 | Cu | 0.001 | 2400 | — | 88 |
| 28 | Cu | 0.005 | 6800 | — | 2600 |
| 29 | Cu | 0.01 | 8050 | — | 51000 |
| 30 | Cu | 0.05 | 7900 | — | 3600 |
| *31 | Cu | 0.1 | 12 | — | — |
| ☆32 | Pt/SrTiO$_3$ | — | 8500 | $8 \times 10^{+9}$ | 91 |

In Table 1 and Table 2 below, the samples numbers with a symbol of * correspond to samples outside the scope of the present invention.

As can be seen from Table 1, sample 1 including the TiO$_2$ thin film with no transition metal added provided a low rate of resistance change less than 100%, and samples 2 to 6 and samples 7 to 11 even with transition metals Cr and Mn added respectively also provided a low rate of resistance change less than 100%.

In contrast to these samples, some of samples 12 to 31 including the TiO$_2$ thin film with any of Co, Fe, Ni, and Cu added as a transition metal exhibited 1000% or more for the rate of resistance change. More specifically, samples 12 to 15, 17 to 20, 22 to 25, and 27 to 30 with the additive amount x of Co, Fe, Ni, or Cu as a transition metal satisfying the condition of x≦0.05 exhibited 1000% or more for the rate of resistance change.

Furthermore, samples 13 to 15, 18 to 20, 23 to 25, and 28 to 30 with the additive amount x of Co, Fe, Ni, or Cu as a transition metal satisfying the condition of 0.005≦x≦0.05 provided 6800% or more for the rate of resistance change, comparable to 8500% as the rate of resistance change for sample 32. In particular, samples 13 to 15 and 18 to 20 with Co or Fe added as a transition metal succeeded in the achievement of an extremely high rate of resistance change greater than 10000% when the additive amount x of the transition metal satisfied the condition of 0.005≦x≦0.05.

Next, attention will be focused on the resistance holding time.

Figure 4:
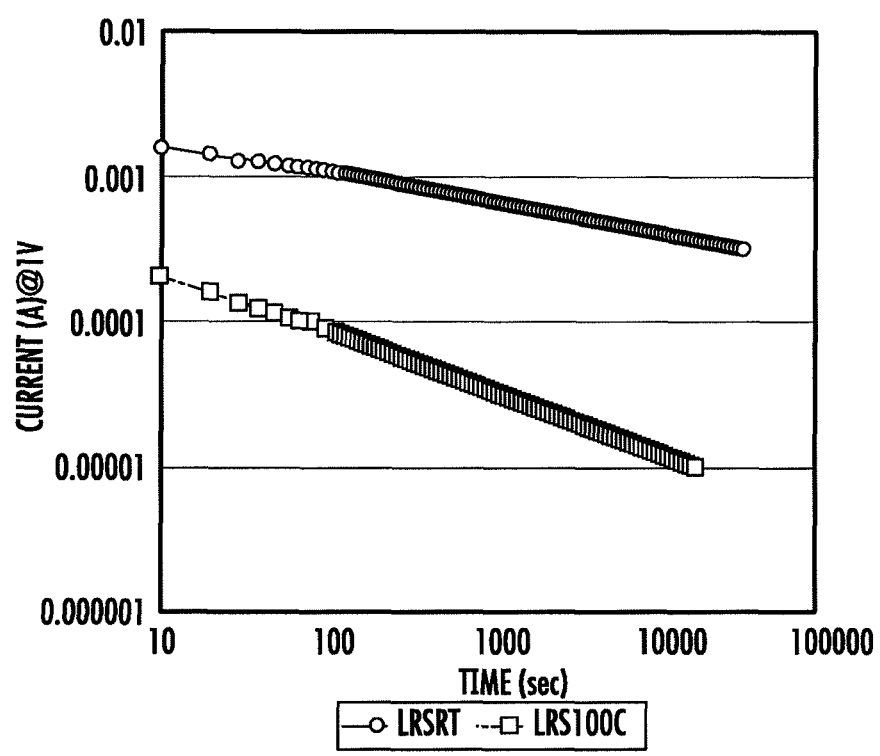
FIG. 4 is a diagram showing resistance holding characteristics in a low resistance state for the resistive memory element according to sample 32 outside the scope of the present invention, obtained in Experimental Example 1.

In the case of sample 32 as a comparative example, as shown in FIG. 4 for the tendency thereof, the time dependence of the change in the resistance in the lower resistance state was increased with the increase in temperature from room temperature to 100° C. As shown in Table 1, the resistance holding time is 91 days at 100° C., which is extremely shorter as compared with the resistance holding time of $8 \times 10^{+9}$ days at room temperature. In view of application to nonvolatile resistive memories, it is a big problem that the resistance holding time varies significantly, that is, is reduced with increase in temperature.

Figure 5:
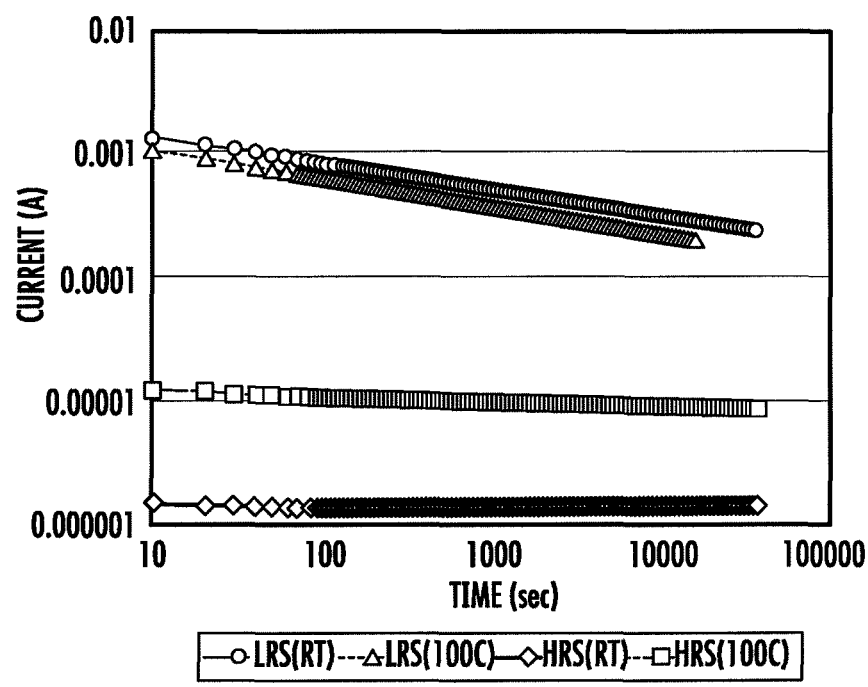
FIG. 5 is a diagram showing resistance holding characteristics for a resistive memory element according to sample 14 within the scope of the present invention, obtained in Experimental Example 1.

In contrast to this sample, samples 13 to 15, 18 to 20, 23 to 25, and 28 to 30 including the TiO$_2$ thin film with any of Co, Fe, Ni, and Cu as a transition metal added to such an extent that the additive amount x of the transition metal satisfies the condition of 0.005≦x≦0.05 succeeded in the achievement of extremely long resistance holding time even at 100° C. unlike sample 32 described above, while the resistance value in the low resistance state has a tendency to change with the passage of time, as shown in FIG. 5 for sample 14. This success can be confirmed from the resistance holding time shown in Table 1.

The results described above can be considered as follows.

The additive-free TiO$_2$ thin film easily causes defects such as oxygen defects, and even in the case of using an electrode with a large work function for Schottky junction, fails to form a favorable Schottky barrier, and thus provides only a low rate of resistance change with a high leakage current. On the other hand, the TiO$_2$ thin film with the transition metal added causes the added transition metal to form a level, and compensate for defects, thus allowing for the achievement of a favorable Schottky barrier.

However, among the transition metals, Mn or Cr shows only a low rate of resistance change. While this is believed to be because the interface state and the amount of defectives resulting in a resistance change were reduced excessively, the clear cause is so far not well known. On the other hand, in the case of Co, Fe, Ni, and Cu, a favorable Schottky barrier is formed, thereby allowing for the achievement of a high rate of resistance change.

As for Co, Fe, Ni, and Cu as a transition metal, even when the additive amount x of the transition metal is 0.001, a high rate of resistance change of 1000% or more can be achieved, while the resistance holding time at 100° C. is comparable to that in the case of sample 32 as a comparative example, such as 1000 days or less. This is believed to be because the low additive amount results in a low state density for the level suppressing resistance relaxation. On the other hand, the additive amount x more than 0.05 is believed to excessively increase the resistance value of the TiO$_2$ thin film itself to make it less likely to form a Schottky barrier exhibiting a resistance change, and thus showing only a low rate of resistance change.

As described above, the use of the resistive memory element according to the present invention allows, as is clear from Table 1, the achievement of excellent resistance holding characteristics in the actual operating temperature region (at room temperature or more), and allows for a significant improvement of the resistance holding characteristics in the low resistance state, which has been challenging for Schottky barrier type resistive switching elements.

It is to be noted that while the mechanism has not been clarified completely because of its unclear points, there is believed, from the time dependence of the resistance value in the low resistance state, to be a possibility of some gradual relaxation (re-emission or retrapping of trapped or emitted electrons, migration of defects, etc.), and the TiO$_2$ thin film with the effective transition metal added is presumed to allow the formation of a level in the transition metal, at the electrode interface, and in bulk for further stabilization of the metastable state (that is, the low resistance state), and thus allow for a significant improvement of the resistance holding characteristics, that is, the resistive memory effect.

In addition, for the samples within the scope of the present invention prepared in the experimental example described previously, as a result of TEM observation for the $TiO_2$ thin film with the effective transition metal added, it has been determined that the $TiO_2$ thin film is a polycrystalline body. Furthermore, it has been determined that this polycrystalline body makes a contribution to improving the resistive memory effect, in particular, the resistance holding characteristics in the low resistance state. More specifically, it has been determined that it is not possible to achieve sufficient resistive memory characteristics even when a Schottky barrier at the interface between the electrode and the thin film is used to succeed in producing a substantial resistance change. For this reason, although the mechanism is not clear, providing discontinuous structures such as grain boundaries for trapping electrons to make electron traps and oxygen defects more likely to be produced is presumed to make a contribution to preventing the resistance in the low resistance state from being increased with time.

As described above, the resistive memory element according to the present invention provides a high rate of resistance change, and can be thus applied advantageously as, for example, an impedance switching element. An embodiment will be described below in the case of using the resistive memory element according to the present invention as an impedance switching element.

Typically, a PIN diode type switching element or a FET transistor type switching element is used as a switching element of a RF signal circuit.

In the case of the PIN diode type switching element, the ON/OFF of the RF signal circuit is achieved in such a way that the low resistance state during the application of a forward bias is used an ON state, whereas the high resistance state during the application of a reverse bias is used an OFF state. On the other hand, in the case of the FET transistor type switch, the ON/OFF of the RF signal circuit is achieved in such a way that the low resistance state during the application of a gate voltage is used an ON state, whereas the high resistance state during no application of the gate voltage is used an OFF state.

However, in the case of the PIN diode type switching element, it is necessary to apply a voltage in the forward direction of the PIN diode in order to bring the element into an ON state, and continue to apply the voltage in the forward direction in order to keep the ON state, and the PIN diode type switching element has the problem of extremely high power consumption resulting from significantly large amounts of current flowing, because this state corresponds to the low resistance state.

On the other hand, in the case of the FET transistor type switching element, the power consumption is low because large amounts of current never flow through the gate even during the application of the gate voltage. However, the FET transistor type switching element has the problem of the need to continue to apply the gate voltage in order to keep the ON state. In addition, the FET transistor type switching element also has the problem of high cost because of its complex structure as compared with the case of the PIN diode type switching element.

In contrast to these elements, in the case of using the resistive memory element as a Schottky junction device according to the present invention, it is possible to change the impedance at the same time with the change in resistance, and the resistive memory element can be used as an impedance switching element as in the case of the PIN diode. Furthermore, the resistive memory element according to the present invention has the resistive memory function, there is thus no need to continue to apply any voltage after switching to the low resistance state, thereby allowing the power consumption to be reduced. Therefore, it is possible to solve the problem of power consumption, which is a drawback of the PIN diode type, and the problem of the need to continue to apply a voltage in order to keep the ON state, which is a drawback of both the PIN diode type and the FET transistor type.

It is to be noted that conventionally known junctional resistance change elements such as, for example, $SrTiO_2/SrRuO_2$, are insufficient in terms of rate of resistance change and resistive memory characteristics, for the achievement of a device which can solve the problems described above.

As in the case of the resistive memory element according to the present invention, the addition of a transition metal to $TiO_2$ for the formation of a level in the bandgap of the $TiO_2$ allows the achievement of an impedance switching element which has a high rate of resistance change and has excellent resistive memory characteristics. An experimental example will be described below, which was carried out to confirm this achievement.

Experimental Example 2

In Experimental Example 2, the samples prepared in Experimental Example 1 described previously were used to make evaluations on impedance frequency characteristic in the high resistance state and the low resistance state.

In this evaluation test, with the use of the same current voltage generator as in the case of Experimental Example 1, a voltage pulse was applied to the samples to switch the resistance state to each of the high resistance state and the low resistance state, and then, with the use of an LCR meter ("HP4284" from Hewlett-Packard Company), evaluations of impedance frequency characteristics were made in the frequency band of 100 Hz to 1 MHz. Then, the impedance in the high resistance state and the impedance in the low resistance state were each obtained at 10 kHz from the obtained frequency characteristics, and the rate of impedance change was calculated on the basis of the formula of Rate of Impedance Change [%]=(Impedance in High Resistance State−Impedance in Low Resistance State)/Impedance in Low Resistance State×100. The results are shown in Table 2. It is to be noted that the "Additive Element", "Additive Amount", and "Rate of Resistance Change" shown in Table 1 are listed again in Table 2, in particular, so that the correlation between the rate of resistance change and the rate of impedance change is easily figured out. In addition, in Table 2, the rate of 0% for the rate of impedance change means almost 0%, and to be precise, 5% or less.

TABLE 2

| | $Ti_{1-x}M_xO_2$ | | | Rate of |
| Sample Number | Additive Element (M) | Additive Amount (x) | Rate of Resistance Change [%] | Impedance Change [%] (no bias, 10 kHz) |
| --- | --- | --- | --- | --- |
| * 1 | — | 0 | 58 | 0 |
| * 2 | Cr | 0.001 | 67 | 0 |
| * 3 | Cr | 0.005 | 88 | 0 |
| * 4 | Cr | 0.01 | 50 | 0 |
| * 5 | Cr | 0.05 | 48 | 0 |
| * 6 | Cr | 0.1 | 24 | 0 |
| * 7 | Mn | 0.001 | 33 | 0 |
| * 8 | Mn | 0.005 | 50 | 0 |
| * 9 | Mn | 0.01 | 45 | 0 |

TABLE 2-continued

| | | $Ti_{1-x}M_xO_2$ | | Rate of |
| Sample Number | Additive Element (M) | Additive Amount (x) | Rate of Resistance Change [%] | Impedance Change [%] (no bias, 10 kHz) |
|---|---|---|---|---|
| * 10 | Mn | 0.05 | 35 | 0 |
| * 11 | Mn | 0.1 | 9 | 0 |
| * 12 | Co | 0.001 | 2200 | 14 |
| 13 | Co | 0.005 | 48000 | 5200 |
| 14 | Co | 0.01 | 100000 | 7750 |
| 15 | Co | 0.05 | 32000 | 5050 |
| * 16 | Co | 0.1 | 44 | 0 |
| * 17 | Fe | 0.001 | 2700 | 12 |
| 18 | Fe | 0.005 | 35000 | 5700 |
| 19 | Fe | 0.01 | 28000 | 5100 |
| 20 | Fe | 0.05 | 30500 | 5200 |
| * 21 | Fe | 0.1 | 70 | 0 |
| * 22 | Ni | 0.001 | 1200 | 8 |
| 23 | Ni | 0.005 | 8900 | 3200 |
| 24 | Ni | 0.01 | 9100 | 3680 |
| 25 | Ni | 0.05 | 7500 | 3560 |
| * 26 | Ni | 0.1 | 33 | 0 |
| * 27 | Cu | 0.001 | 2400 | 20 |
| 28 | Cu | 0.005 | 6800 | 3050 |
| 29 | Cu | 0.01 | 8050 | 3150 |
| 30 | Cu | 0.05 | 7900 | 3100 |
| * 31 | Cu | 0.1 | 12 | 0 |
| ☆ 32 | Pt/SrTiO$_3$ | — | 8500 | 50 |

Figure 6:
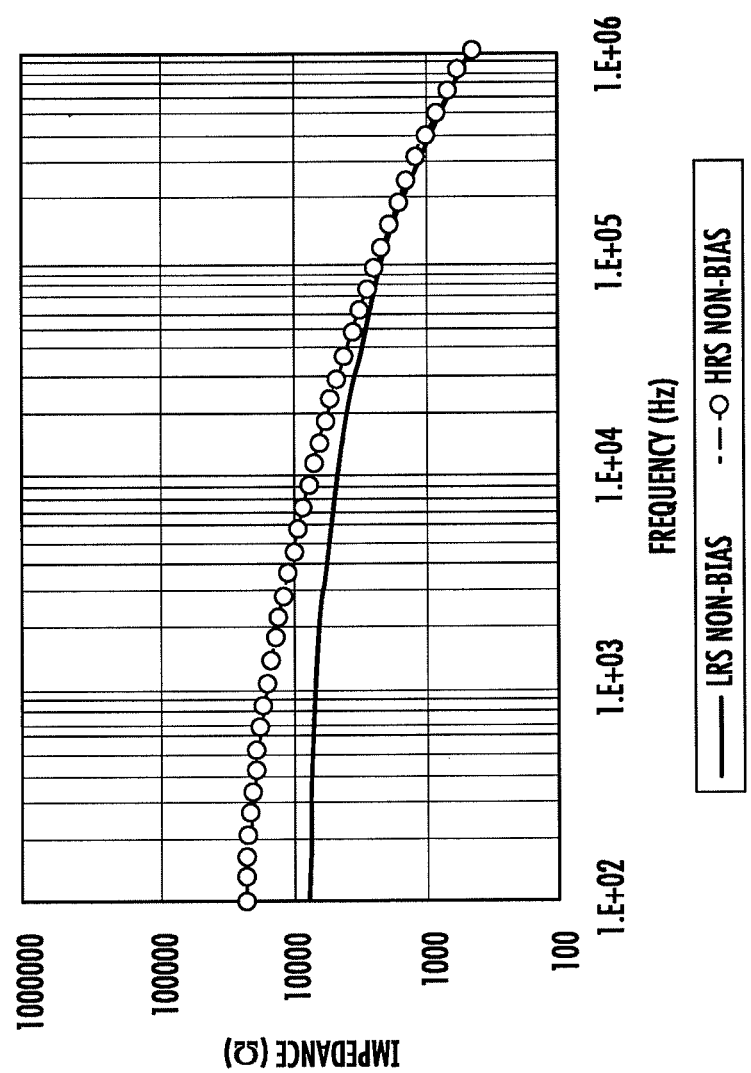
FIG. 6 is a diagram showing impedance frequency characteristics for the resistive memory element according to sample 32 outside the scope of the present invention, obtained in Experimental Example 2.

As shown in Experimental Example 1, sample 32 as a comparative example provided poor resistive memory characteristics, but succeeded in the achievement of relatively significant resistance change characteristics with a rate of resistance change of 8500%. The evaluation result of the impedance characteristics of sample 32 is shown in FIG. 6. While sample 32 can achieve a high rate of resistance change in the case of a direct-current resistance, there was a small difference between the impedance in the high resistance state of sample 32 and the impedance in the low resistance state thereof, and the difference was much smaller with the increase in frequency. As shown in Table 2, the rate of impedance change was quite low and 50% at the frequency of 10 kHz.

Figure 7:
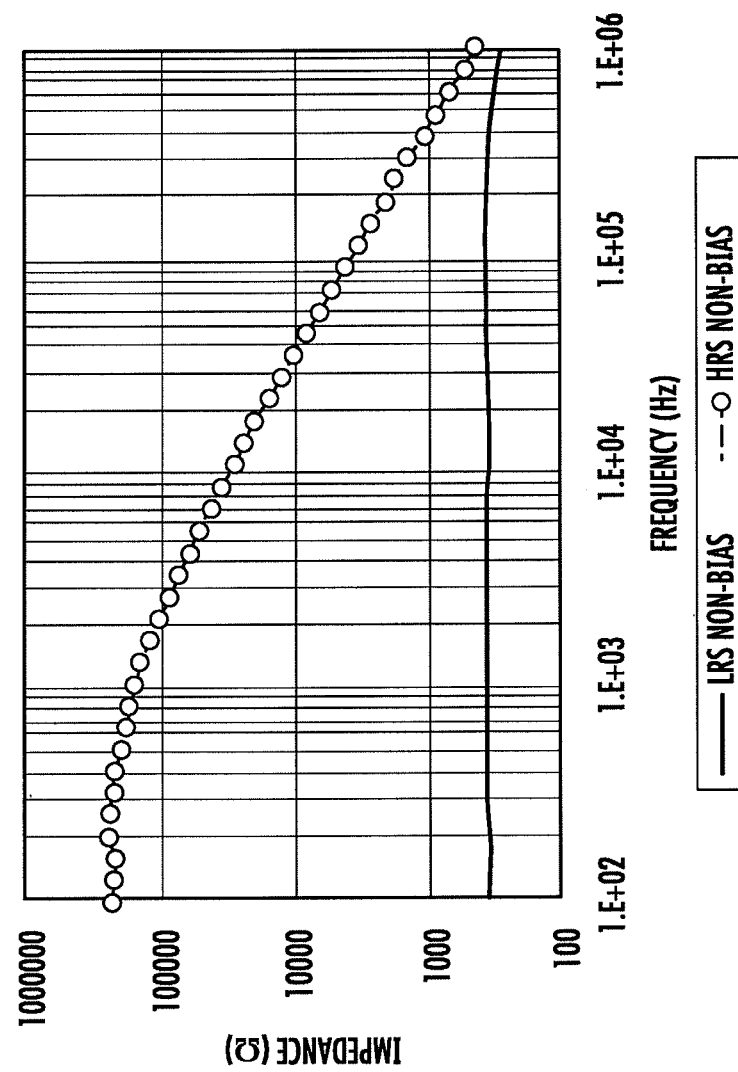
FIG. 7 is a diagram showing impedance frequency characteristics for the resistive memory element according to sample 14 within the scope of the present invention, obtained in Experimental Example 2.

On the other hand, as a representative of samples 13 to 15, 18 to 20, 23 to 25, and 28 to 30 within the scope of the present invention, the impedance characteristics of sample 14 are shown in FIG. 7. As in the case of sample 32 shown in FIG. 6, the difference in impedance is smaller due to a capacitive component with the increase in frequency in the case of sample 14. However, with quite a large difference in a low-frequency region, sample 14 succeeded in the achievement of quite a high value of 7750% for the rate of impedance change at the frequency of 10 kHz as shown in Table 2.

As shown in Table 2, the same applies to the other samples within the scope of the present invention.

More specifically, samples 13 to 15, 18 to 20, 23 to 25, and 28 to 30 within the scope of the present invention succeeded in the achievement of quite a high rate of impedance change greater than 3000% at the frequency of 10 kHz while achieving a high rate of resistance change.

In contrast to these samples, sample 32 as a comparative example provided quite a low rate of 50% for the rate of impedance change as described previously even with a comparative high rate of resistance change, as compared with samples 13 to 15, 18 to 20, 23 to 25, and 28 to 30 within the scope of the present invention.

This is presumed to be because the impedance (Z) is a combination of not only a resistance component (R) but also a capacitance component (C) and an inductance component (L), and in the case of samples 13 to 15, 18 to 20, 23 to 25, and 28 to 30 within the scope of the present invention, the C component has a smaller influence for the reasons such as not only the high rate of resistance change but also the lower resistance in the low resistance state as compared with sample 32, thereby providing the high rate of impedance change. In addition, the resistive memory characteristics also make a large contribution, and in the case of poor resistive memory characteristics, the resistance in the low resistance state is believed to be immediately increased, thus resulting in the low rate of impedance change.

As described above, the resistive memory element according to the present invention allows not only the achievement of a high rate of resistance change and excellent resistive memory characteristics, but also the achievement of a high rate of impedance change, and can be used advantageously not only as a resistive memory device using the resistance change, but also as an impedance switching element.

It is to be noted that while the resistive memory elements prepared in this experimental example are limited in terms of the frequency band for varying the impedance, the characteristics of the resistive memory elements can be expected to be improved to the higher frequency side by the reduction in capacity through the microstructure formation of the oxide semiconductor constituting the element body, and it is believed that the resistive memory elements can be used as impedance switching elements with low power consumption in a wider frequency band.

In addition, the use of the resistive memory element according to the present invention can achieve not only two states such as a high resistance state and a low resistance state, that is, binary such as "0" and "1", but also at least one intermediate resistance state, preferably, multiple intermediate resistance states between the high resistance state and the low resistance state.

In the resistive memory element according to the present invention, while the mechanism which allows multiple values to be provided favorably as described above has a lot of unclear points, trapping and re-emission of electrons in and from the interface state in the vicinity of the electrode, or migration of oxygen defects, etc. has been conceived as a potential for the origin of the resistance change. As in the case of the compound semiconductor constituting the element body included in the resistive memory element according to the present invention, it is believed that the addition of the transition metal forms an interface or a bulk level, thus resulting in an increase in the number of states which can trap electrodes, or in a valence change, and this increase or valence change resolves the imbalance of charges created by the migration of defects, thereby resulting in the achievement of excellent memory characteristics. The provision of multiple values is believed to be achieved by varying the electron trapping or the degree of migration through the application of a voltage pulse.

Experimental Example 3

In Experimental Example 3, the resistive memory element according to sample 14 prepared in Experimental Example 1 was used to make an evaluation on the provision of multiple values.

Figure 8:
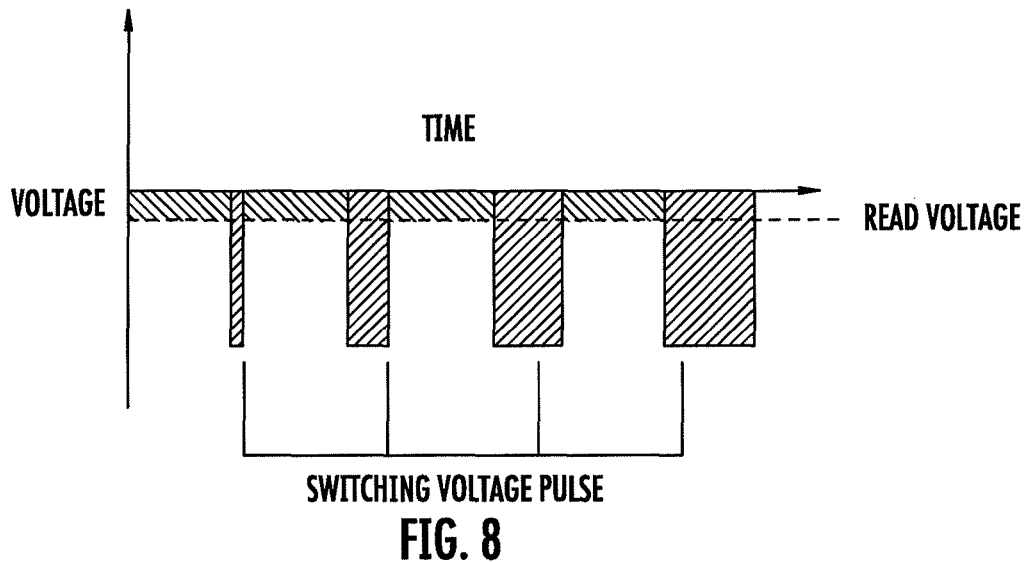
FIG. 8 is a diagram illustrating a first application mode for a voltage pulse applied to a resistive memory element in Experimental Example 3.

More specifically, the measurement of the resistance value was carried out in such a way that when a voltage pulse for switching to the low resistance state was to be applied after switching to the high resistance state, the magnitude of the switching voltage, that is, the pulse amplitude was fixed at −5 V as shown in FIG. 8, whereas the pulse width was gradually increased in the range of 100 ns to 100 μs. The voltage for the measurement is indicated as "Read voltage" in FIG. 8.

Figure 9:
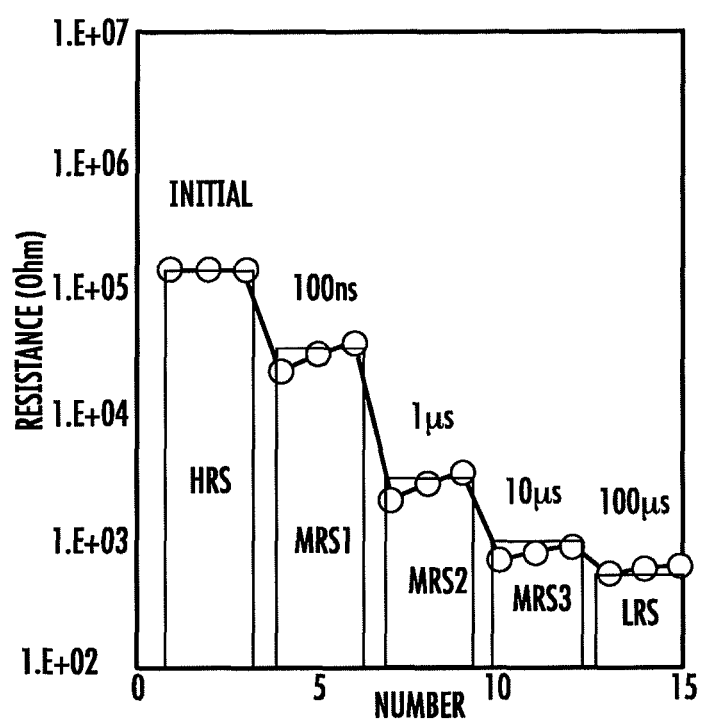
FIG. 9 is a diagram showing the resistance change of a resistive memory element in the case of applying a voltage pulse in the mode shown in FIG. 8.

More specifically, as shown in FIG. 9, (1) the resistance value in an initial resistance state (HRS) was measured three times, (2) then, the resistance value in a first intermediate resistance state (MRS1) was measured three times after applying a pulse voltage with a pulse amplitude of −5 V and a pulse width of 100 ns once, (3) then, the resistance value in a second intermediate resistance state (MRS2) was measured three times after applying a pulse voltage with a longer pulse width of 1 μs once, (4) then, the resistance value in a third intermediate resistance state (MRS3) was measured three times after applying a pulse voltage with a longer pulse width of 10 μs once, and (5) then, the resistance value in a low resistance state (LRS) was measured three times after applying a pulse voltage with a longer pulse width of 100 μs once.

As can be seen from FIG. 9, the varying pulse width of the switching voltage allows multiple states with intermediate values (MRS) to be set between the high resistance state (HRS) and the low resistance state (LRS).

Figure 10:
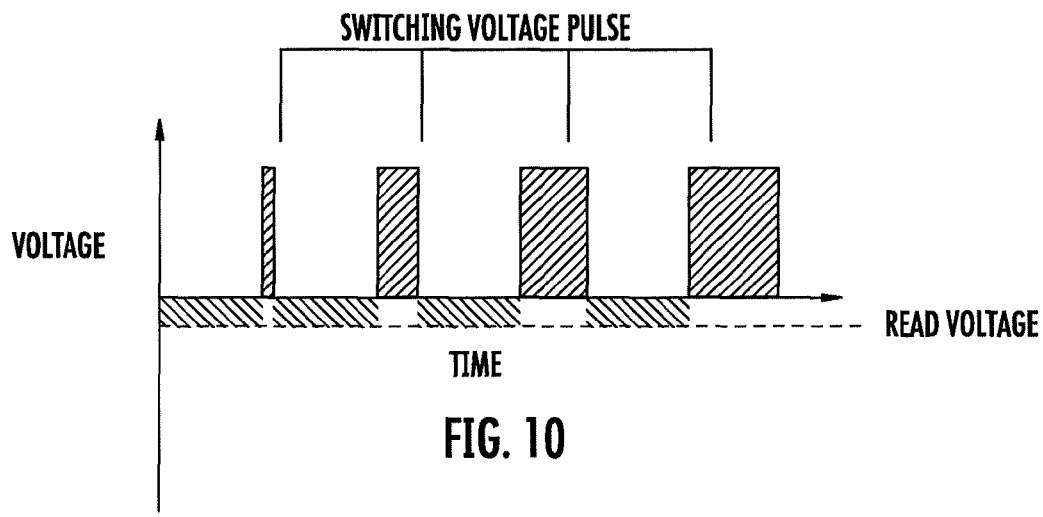
FIG. 10 is a diagram illustrating a second application mode for a voltage pulse applied to a resistive memory element in Experimental Example 3.

Next, in contrast to the foregoing, the measurement of the resistance value was carried out in such a way that when a voltage pulse for switching to the high resistance state was to be applied after switching to the low resistance state, the pulse amplitude was fixed at +5 V as shown in FIG. 10, whereas the pulse width was gradually increased in the range of 100 ns to 100 μs. More specifically, as shown in FIG. 11, (6) the resistance value in an initial resistance state (LRS) was measured three times, (7) then, the resistance value in a first intermediate resistance state (MRS1) was measured three times after applying a pulse voltage with a pulse amplitude of +5 V and a pulse width of 100 ns once, (8) then, the resistance value in a second intermediate resistance state (MRS2) was measured three times after applying a pulse voltage with a longer pulse width of 1 μs once, (9) then, the resistance value in a third intermediate resistance state (MRS3) was measured three times after applying a pulse voltage with a longer pulse width of 10 μs once, and (10) then, the resistance value in a high resistance state (HRS) was measured three times after applying a pulse voltage with a longer pulse width of 100 μs once.

Figure 11:
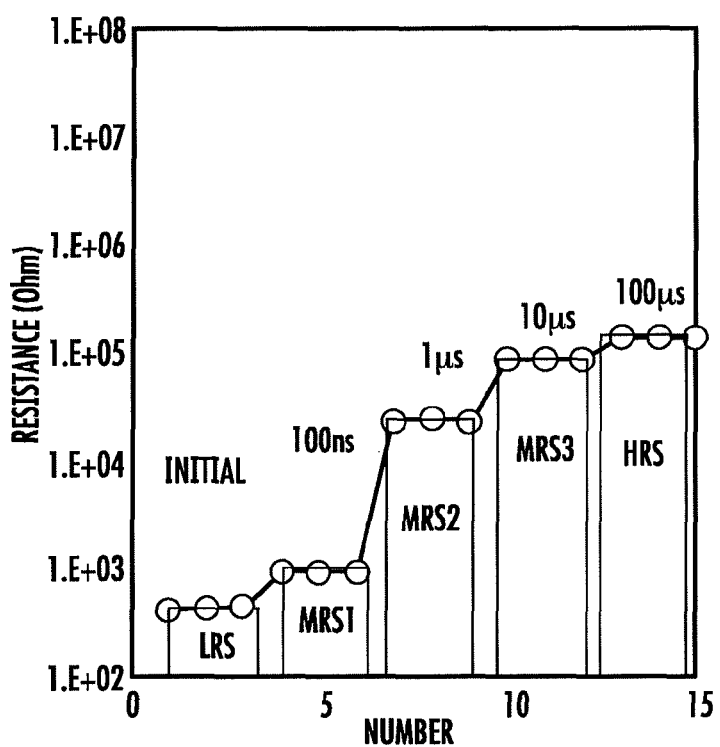
FIG. 11 is a diagram showing the resistance change of a resistive memory element in the case of applying a voltage pulse in the mode shown in FIG. 10.

As can be seen from FIG. 11, the varying pulse width of the switching voltage allows multiple states with intermediate values (MRS) to be set between the low resistance state (LRS) and the high resistance state (HRS).

Experimental Example 4

In Experimental Example 4, the resistive memory element according to sample 14 prepared in Experimental Example 1 was used to make an evaluation on the provision of multiple values, as in the case of Experimental Example 3. Experimental Example 4 is different from Experimental Example 3 in the application mode for a pulse voltage.

Figure 12:
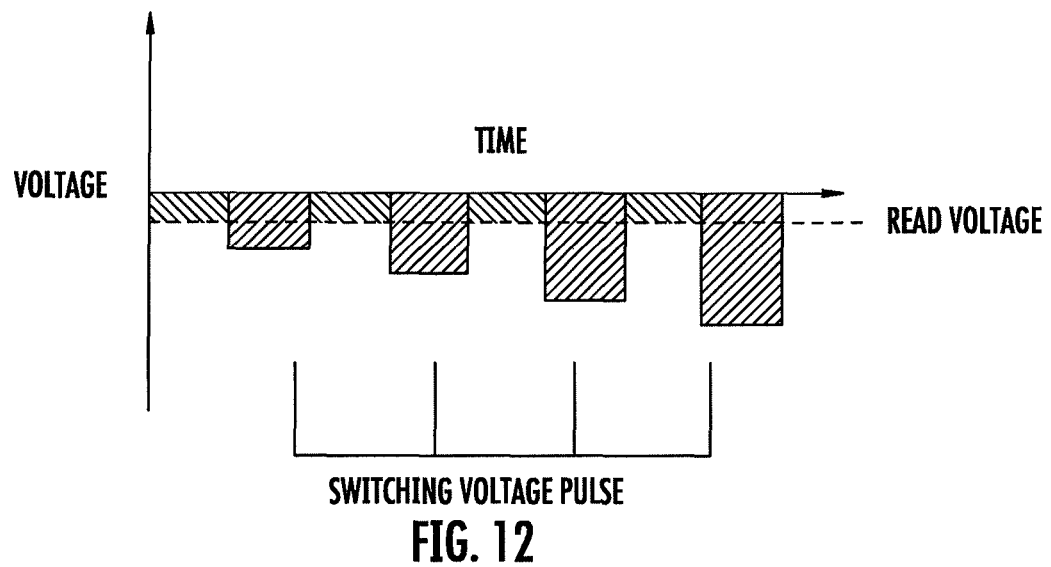
FIG. 12 is a diagram illustrating a first application mode for a voltage pulse applied to a resistive memory element in Experimental Example 4.

More specifically, the measurement of the resistance value was carried out in such a way that when a voltage pulse for switching to the low resistance state was to be applied after switching to the high resistance state, the pulse width of the switching voltage was fixed at 100 μs as shown in FIG. 12, whereas the absolute value of the pulse amplitude was gradually increased in the range of −1 V to −5 V. The voltage for the measurement is indicated as "Read voltage" in FIG. 12.

Figure 13:
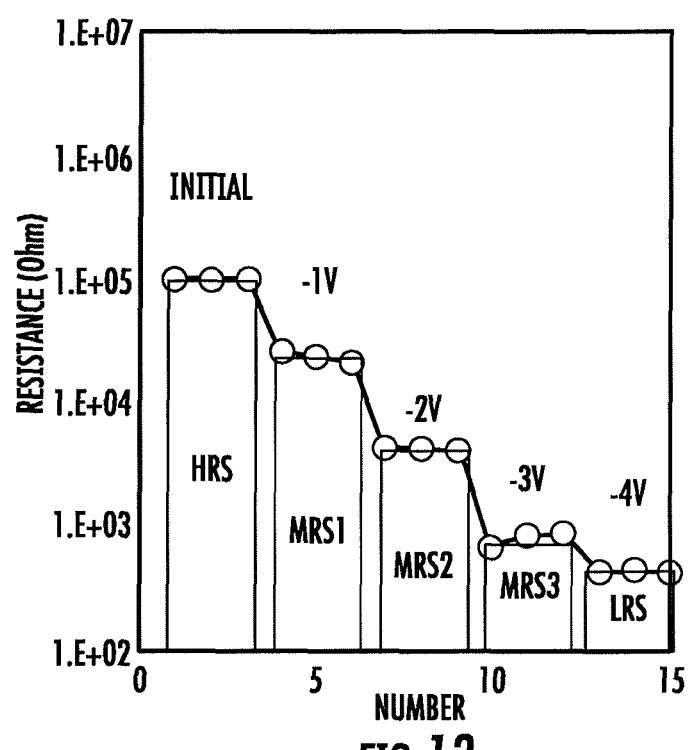
FIG. 13 is a diagram showing the resistance change of a resistive memory element in the case of applying a voltage pulse in the mode shown in FIG. 12.

More specifically, as shown in FIG. 13, (1) the resistance value in an initial resistance state (HRS) was measured three times, (2) then, the resistance value in a first intermediate resistance state (MRS1) was measured three times after applying a pulse voltage with a pulse width of 100 μs and a pulse amplitude of −1 V once, (3) then, the resistance value in a second intermediate resistance state (MRS2) was measured three times after applying a pulse voltage with a pulse amplitude increased to −2 V in absolute value once, (4) then, the resistance value in a third intermediate resistance state (MRS3) was measured three times after applying a pulse voltage with a pulse amplitude increased to −3 V in absolute value once, and (5) then, the resistance value in a low resistance state (LRS) was measured three times after applying a pulse voltage with a pulse amplitude increased to −4 V in absolute value once.

As can be seen from FIG. 13, the varying pulse amplitude of the switching voltage allows multiple states with intermediate values (MRS) to be set between the high resistance state (HRS) and the low resistance state (LRS).

Figure 14:
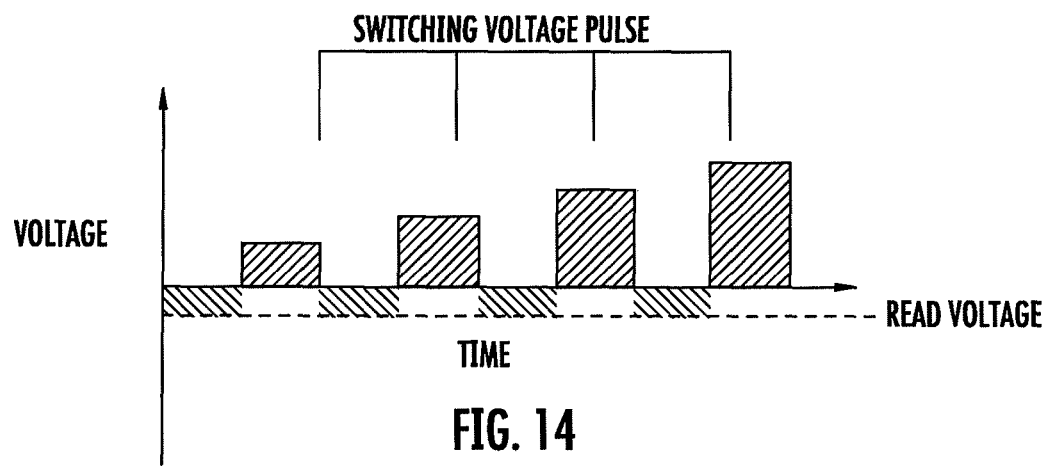
FIG. 14 is a diagram illustrating a second application mode for a voltage pulse applied to a resistive memory element in Experimental Example 4.

Next, in contrast to the foregoing, the measurement of the resistance value was carried out in such a way that when a voltage pulse for switching to the high resistance state was to be applied after switching to the low resistance state, the pulse width was fixed at 100 μs as shown in FIG. 14, whereas the pulse amplitude was gradually increased in the range of +2 V to +5 V. More specifically, as shown in FIG. 15, (6) the resistance value in an initial resistance state (LRS) was measured three times, (7) then, the resistance value in a first intermediate resistance state (MRS1) was measured three times after applying a pulse voltage with a pulse width of 100 μs and a pulse amplitude of +2 V once, (8) then, the resistance value in a second intermediate resistance state (MRS2) was measured three times after applying a pulse voltage with a pulse amplitude increased to +3 V once, (9) then, the resistance value in a third intermediate resistance state (MRS3) was measured three times after applying a pulse voltage with a pulse amplitude increased to +4 V once, and (10) then, the resistance value in a high resistance state (HRS) was measured three times after applying a pulse voltage with a pulse amplitude increased to 5 V once.

Figure 15:
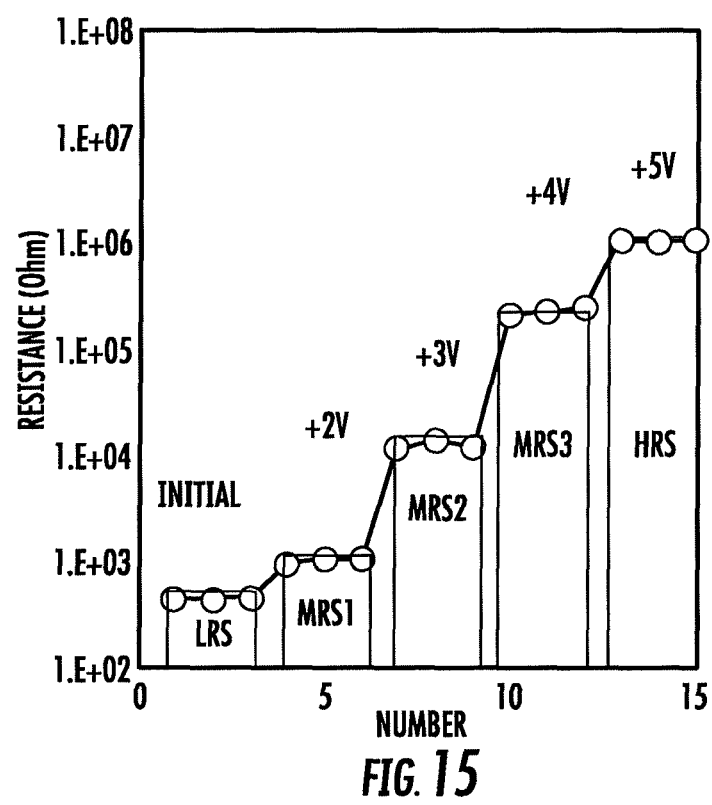
FIG. 15 is a diagram showing the resistance change of a resistive memory element in the case of applying a voltage pulse in the mode shown in FIG. 14.

As can be seen from FIG. 15, the varying pulse amplitude of the switching voltage allows multiple states with intermediate values (MRS) to be set between the low resistance state (LRS) and the high resistance state (HRS).

As can be seen from Experimental Examples 3 and 4, the resistive memory element according to the present invention can achieve a substantial resistance change, thus provide such a difference in resistance that can recognize even multiple intermediate values, and further achieve the stable provision of multiple values because of its excellent resistance holding characteristics.

It is to be noted that while the multiple resistance states were achieved by varying the pulse width and pulse amplitude of the voltage pulse to be applied respectively in Experimental Examples 3 and 4, multiple resistance states can be also achieved by varying the application frequency of the voltage pulse.

In addition, while the resistance value was varied in a step-by-step manner in Experimental Examples 3 and 4, a use mode is also possible in which a pulse voltage with predetermined pulse width, pulse amplitude, or pulse application frequency is applied for switching to a desirable resistance value at once, rather than varying the resistance value in a step-by-step manner.

In addition, when the voltage pulse to be applied is brought into the opposite polarity, it is possible to return to the low resistance state even on the way from the low resistance state to the high resistance state, and vice versa, to return to the high resistance state even on the way from the high resistance state to the low resistance state.

DESCRIPTION OF REFERENCE NUMBERS 1 resistive memory element
2 element body
3, 4 electrode

The invention claimed is:

1. A resistive memory element comprising:
an element body and
at least a pair of electrodes opposed to each other with at least a portion of the element body interposed therebetween, wherein
the element body comprises an oxide semiconductor which has a composition represented by the general formula: $Ti_{1-x}M_xO_2$,
wherein M is selected from at least one of Fe, Co, Ni, and Cu; and
$0.005 \leq x \leq 0.05$.

2. The resistive memory element according to claim 1, wherein the resistive memory element is configured such that when at least the portion of the element body located between the pair of electrodes brought into a low resistance state when a switching voltage in a first direction is applied between the pair of electrodes, the low resistance state of at least the portion located of the element body between the pair of electrodes is held even when the switching voltage in the first direction is eliminated.

3. The resistive memory element according to claim 2, wherein the resistive memory element is configured such that when at least the portion of the element body located between the pair of electrodes is brought into a high resistance state when a switching voltage in a second direction opposite to the first direction is applied between the pair of electrodes, the high resistance state of at least the portion of the element body located between the pair of electrodes is held even when the switching voltage in the second direction is eliminated.

4. The resistive memory element according to claim 1, wherein the oxide semiconductor is a polycrystalline body.

5. The resistive memory element according to claim 1, wherein at least one of the pair of electrodes comprises a material which makes a Schottky junction with the element body.

6. The resistive memory element according to claim 1, wherein the resistive memory element is configured for use in impedance matching.

7. A resistive memory element comprising:
an element body and
first and second electrodes arranged so as to contact the element body, wherein
the first electrode comprises a first material which forms a Schottky barrier in an interface region between the first electrode and the element body,
the second electrode comprises a second material having a greater ohmic junction to the element body as compared with that of the first electrode, and
the element body comprises an oxide semiconductor which has a composition represented by the general formula: $Ti_{1-x}M_xO_2$,
wherein M is selected from at least one of Fe, Co, Ni, and Cu; and
$0.005 \leq x \leq 0.05$.

8. The resistive memory element according to claim 7, wherein the first material of the first electrode which forms the Schottky barrier develops a rectifying property and resistance change characteristics in the interface region between the first electrode and the element body.

9. A method of using the resistive memory element according to claim 7, the method comprising:
applying a first voltage pulse with a first polarity between the first and second electrodes so as to achieve a first resistance state of the resistive memory element; and
applying a second voltage pulse with a second polarity opposite to the first polarity between the first and second electrodes so as to achieve a second resistance state of the resistive memory element, the second resistive state being higher than the first resistive state.

10. The method of using the resistive memory element according to claim 9, further comprising:
applying, between the first and second electrodes, at least one intermediate voltage pulse with the first polarity or the second polarity and with energy between the first voltage pulse and the second voltage pulse so as to achieve at least one intermediate resistance state indicating a resistance value between the first resistance state and the second resistance state.

11. The method of using the resistive memory element according to claim 10, wherein the intermediate voltage pulse has an intermediate value between the first voltage pulse and the second voltage pulse for at least one value selected from pulse width, pulse amplitude, and pulse application frequency.

12. A use of the resistive memory element according to claim 10, wherein the resistive memory element is configured for use as a multivalued memory.

* * * * *